United States Patent
Kohlstedt

(10) Patent No.: US 8,537,590 B2
(45) Date of Patent: Sep. 17, 2013

(54) MEMORY HAVING TUNNEL BARRIER AND METHOD FOR WRITING AND READING INFORMATION TO AND FROM THIS MEMORY

(75) Inventor: Hermann Kohlstedt, Preetz (DE)

(73) Assignee: Forschungszentrum Juelich GmbH, Juelich (DE)

( * ) Notice: Subject to any disclaimer, the term of this patent is extended or adjusted under 35 U.S.C. 154(b) by 240 days.

(21) Appl. No.: 12/736,710

(22) PCT Filed: Apr. 17, 2009

(86) PCT No.: PCT/DE2009/000525
§ 371 (c)(1),
(2), (4) Date: Nov. 2, 2010

(87) PCT Pub. No.: WO2009/140936
PCT Pub. Date: Nov. 26, 2009

(65) Prior Publication Data
US 2011/0051494 A1    Mar. 3, 2011

(30) Foreign Application Priority Data
May 17, 2008 (DE) .......................... 10 2008 024 078

(51) Int. Cl.
*G11C 11/00* (2006.01)
*H01L 27/108* (2006.01)
*H01L 29/94* (2006.01)

(52) U.S. Cl.
USPC ........... 365/148; 365/163; 257/104; 257/105; 257/106; 257/296; 257/E29.34; 257/E29.339

(58) Field of Classification Search
USPC ................ 365/148, 163; 257/104, 105, 106, 257/296, E29.34, E29.339
See application file for complete search history.

(56) References Cited

U.S. PATENT DOCUMENTS

| | | |
|---|---|---|
| 2002/0153583 A1 | 10/2002 | Frazier et al. |
| 2002/0153584 A1 | 10/2002 | Frazier et al. |
| 2003/0052320 A1 | 3/2003 | Tran et al. |
| 2004/0238812 A1 | 12/2004 | Wasshuber |
| 2005/0040389 A1 | 2/2005 | Wasshuber |
| 2005/0153484 A1 | 7/2005 | Wasshuber |
| 2006/0050598 A1 | 3/2006 | Rinerson et al. |

(Continued)

FOREIGN PATENT DOCUMENTS

| | | |
|---|---|---|
| DE | 103 23 414 | 12/2004 |
| EP | 1 293 988 | 3/2003 |
| WO | WO-2006/029228 | 3/2006 |

*Primary Examiner* — Ly D Pham
(74) *Attorney, Agent, or Firm* — Jordan and Hamburg LLP

(57) ABSTRACT

A resistive memory comprises a tunnel barrier. The tunnel barrier is in contact with a memory material which has a memory property that can be changed by a write signal. Because of the exponential dependence of the tunnel resistance on the parameters of the tunnel barrier, a change in the memory property has a powerful effect on the tunnel resistance, whereby the information stored in the memory material can be read. A solid electrolyte (ion conductor), for example, is suitable as a memory layer, wherein the ions thereof can be moved relative to the interface with the tunnel barrier by the write signal. The memory layer, however, can also be, for example, a further tunnel barrier, the tunnel resistance of which can be changed by the write signal, for example by displacement of a metal layer present in this tunnel barrier. The invention further provides a method for storing and reading information to and from a memory.

12 Claims, 1 Drawing Sheet

(56) References Cited

U.S. PATENT DOCUMENTS

| | | |
|---|---|---|
| 2006/0171200 A1 | 8/2006 | Rinerson et al. |
| 2007/0007610 A1* | 1/2007 | Saito et al. .................... 257/422 |
| 2007/0117256 A1 | 5/2007 | Stewart et al. |
| 2007/0224707 A1* | 9/2007 | Hosotani ........................... 438/3 |
| 2008/0006812 A1 | 1/2008 | Kozicki et al. |
| 2008/0078985 A1 | 4/2008 | Meyer et al. |
| 2008/0090337 A1 | 4/2008 | Williams |
| 2008/0094876 A1 | 4/2008 | Siau et al. |
| 2008/0144357 A1 | 6/2008 | Siau et al. |
| 2011/0007544 A1* | 1/2011 | Vaithyanathan et al. ...... 365/148 |
| 2011/0062537 A1* | 3/2011 | Oh et al. ....................... 257/421 |

\* cited by examiner

MEMORY HAVING TUNNEL BARRIER AND METHOD FOR WRITING AND READING INFORMATION TO AND FROM THIS MEMORY

The invention relates to a memory and to a method for writing and reading information to and from a memory.

BACKGROUND OF THE INVENTION

The miniaturization of conventional dynamic random access memories (DRAM) has reached its limits. The information is stored in the form of charges, which decrease as the size of the memory cells decreases. When a bit is represented by fewer than approximately 100-1000 elementary charges, it is technically no longer possible to reliably distinguish between the two states of 0 and 1.

For this reason, research is currently underway into resistive random access memories (RRAM), wherein information is written by way of a change in the resistance of the memory material. These memories promise significantly higher data densities than DRAMs and offer the prospect of a universal memory, which also replaces bulk memory because, in principle, they can be designed to be non-volatile. The magazine *Nature Materials*, Vol. 6, Issue 12 (2008), provides an overview of the current research situation.

The disadvantage of existing resistive memories is that the resistance values thereof vary within a wide range, and the production thereof is difficult to reproduce. As a result, it has not yet been possible to commercialize the technology, even though the technology has been known and under discussion since the 1960s.

SUMMARY OF THE INVENTION

It is therefore the object of the invention to provide a resistive memory in which the resistance values vary within a lesser range, and wherein production can be better reproduced than with resistive memories according to the prior art.

This object is achieved according to the invention by a memory according to the main claim and by a method according to the additional independent claim. Further advantageous embodiments will be apparent from the dependent claims.

DESCRIPTION OF THE INVENTION

As part of the invention, a memory for information was developed. This memory comprises a tunnel barrier and electric contacting means for conducting a current through the tunnel barrier.

According to the invention, the tunnel barrier contacts a memory material, which has a memory property. This memory property can be changed by a write signal. Given the contact with the tunnel barrier, a change in the memory property results in a change in the tunnel resistance for the current flowing through the tunnel barrier.

The write signal to which the memory material responds with a change in the memory property can be, for example, an electric voltage that is supplied or a an electric current that is supplied. However, it can, for example, also be optical excitation resulting from irradiation by light, such as laser light, or a temperature increase.

The change in the memory property resulting from the write signal is advantageously reversible, so that the memory can be used as a random access memory (RAM) or a bulk memory. If the change is not reversible, the memory can only be used as a read-only memory (ROM), as a programmable read-only memory (PROM), or a programmable logic array (PLA).

The term 'contact' is not limited to arrangements in which the tunnel barrier and memory material are layers that can be distinguished from each other and adjoin each other. A contact also exists, for example, when the memory material is present in the form of inclusions in the tunnel barrier.

It has been recognized that, compared to resistive memories according to the prior art, the memory according to the invention can be produced with greater reproducibility and lower relative variance of the resistance values.

The reason for this is that, in contrast to the classic resistive memories according to the prior art, according to the invention, quantum-mechanical tunnel resistance is used. This resistance depends exponentially on the effective thickness of the tunnel barrier, the charge density, and the band structure at the interfaces of the tunnel barrier, as well as on the effective mass of the tunneling electrons. It was found that a minor, and hence well-definable, change in the memory property of the memory layer can be used to change the tunnel resistance over a much larger dynamic range than is possible in classic resistive memories. The inevitable fluctuations during the production process pale in comparison to this dynamic range, and represent a much lower relative variance of the resistance values than has heretofore been possible according to the prior art. This fulfills a key requirement that is placed on a memory which is to be used in an array comprising a plurality of nominally identical memory cells.

The reproducibility of the production is also enhanced because changes are not necessarily required to the tunnel barrier as such, the design and reproducible production of which have already been technologically optimized. For example, a commercially available tunnel barrier may be coated with a memory material or brought in contact with this memory material in another manner, so as to produce the memory according to the invention.

In a particularly advantageous embodiment of the invention, the memory material has a memory property which, when changed, results in a change in the level of the conduction band in the tunnel barrier. This can be achieved, for example, by way of a memory material in which the positions of ions, serving as the memory property, can be varied by applying an electric voltage (and thus an electric field) as the write signal. To this end, the ions in the memory material should be displaceable from the lattice sites thereof by lower electrical voltages than ions in the tunnel barrier. Since the tunnel resistance depends exponentially on the charge density caused by the ions and the electric field strength at the interface between the memory material and tunnel barrier, the ions must be moved by only a very small distance (a few nanometers) to bring about a large change in the tunnel resistance; the memory material can therefore be configured as a very thin layer (between 0.5 nm and 20 nm). The memory material can advantageously be designed as a matrix material, so as to allow the ions to move therein.

The effective height of the tunnel barrier on which the tunnel resistance depends exponentially is a function of the work function between the tunnel barrier and the material adjoining the same. This work function is determined by the difference in the Fermi levels between the tunnel barrier on the one hand and the adjoining material on the other. This difference, and hence the tunnel resistance, can be changed by supplying or removing ions at the interface between the tunnel barrier and memory material. In this way, the barrier height is changed and, consequently, also the tunnel current. The barrier height is decisively determined by the electronic properties (band structure) at the interface. The presence or absence of ions at the interface can be equated with a change in the material properties, and thus also in the barrier height. By supplying ions at the interface of the memory material, the band structure thereof is changed locally at this interface. The band structures of the tunnel barrier and of the memory material in turn adapt locally to each other at this interface.

A much weaker electric field suffices as the driving force for such a movement over just a few nanometers than was previously required for writing information to resistive memories having a thickness in the order of micrometers, and the write process can be accomplished more quickly given the short path. Because ions in the memory material can be moved at velocities on the order of m/s, it is advantageously sufficient to supply the electric field for a duration of 10 ns or less, and preferably for a duration of 5 ns or less. In contrast, writing to conventional flash memories or resistive memories requires durations in the order of μs to ms.

Notably, it suffices to apply a write voltage between 0.1V and 3V by way of the memory material. Writing to previous resistive memories typically required voltages of 10 V or more. Given the lower required write voltage, it is also possible to change the positions of the ions along the entire interface between the memory material and the tunnel barrier.

If the memory material is such that this change is reversible, significantly more switching cycles are possible than in resistive memories according to the prior art. The high write voltage required when writing information to resistive memories causes the active material to electrically break down along few channels, thereby undergoing changes in the properties thereof. Precisely where in the material these channels form can be neither predicted nor controlled. As a result, these changes cannot be completely reversed when deleting the resistive memory. The material degenerates irreversibly, which limits the number of write cycles that are possible and necessitates complex defect management for the successively failing memory cells.

The memory material advantageously comprises a solid electrolyte (ion conductor). This is a material which conducts ions in the solid body at the temperature and electric field strength present in the particular application case. This ion conductivity is always associated with mass transport inside the solid body.

Not only the ion conductivity of each material, but also the physical properties of the tunnel barrier are dependent on the temperature, with the temperature dependence of the ion conductivity generally dominating. The person skilled in the art is faced with the problem of implementing the memory for a specified usage temperature. For example, for usage in outer space, the temperatures will be very low, while these will be very high when used in, or on, an engine or a fuel cell. Since both the temperature behavior of tunnel barriers made of different materials and the temperature behavior of ion conductors are well researched and documented, a person skilled in the art can make a preselection of combinations of tunnel barriers and ion conductors that are functional at the desired usage temperature. Considering the added boundary condition that the tunnel barrier and ion conductor must be compatible with each other, only a few possible combinations will remain for the specific application case, which the person skilled in the art can test without undue experimentation. The functional capability will not be a yes-no property, but a gradual property, allowing the person skilled in the art to use the evaluation of unsuccessful experiments as an added resource in achieving success.

For the use at room temperature, for example, a material such as $Ag_2S$, $AgS$, $Ag_2O$, $Ag_2Se$, $Ag$, $GeSbSe$, $CuO_2$ or $Pb_4Cu_{17}Cl_{13}$ can be used as the solid electrolyte. These materials are compatible with common tunnel barriers that comprise, for example, $SiO_2$, $GaN$, $Al_2O_3$, $MgO$, $SrTiO_3$, and $Si_3N_4$. The particularly good compatibility of $Ag_2O$ with $Si_3N_4$ and of $AgGeSbSe$ with $Si_3N_4$ or $SiO_2$ should, in particular, be highlighted.

Advantageously, the interfaces of the memory material with the tunnel barrier and with the electric contacting means are inert. This means that no ions pass through the interfaces, and no chemical reaction takes place between the memory material and adjoining materials. Such an inert interface can be implemented, for example, by a material combination of a tunnel barrier and a memory material in which the tunnel barrier substantially only comprises defects that are not accessible to ions from the memory material. For example, the materials can be matched to each other so that the defects in the tunnel barrier are smaller than the radii of the ions in the memory material. The interfaces, however, can also be designed in different manners as diffusion and/or migration barriers for the ions in the memory material. The potential values and the defect density should be such that ions cannot penetrate into the tunnel barrier either as a result of thermal effects or as a result of an electric field.

The tunnel barrier advantageously comprises an amorphous material. Defects only act locally in an amorphous material: because no regular lattice is present, no mobility exists for ions along lattice axes. Consequently, the ions from the memory material can penetrate into a tunnel barrier made of amorphous material only with difficulty, if at all.

Nitrides or other compounds containing no oxygen are chemically very stable and therefore well suited to be compatible as materials for tunnel barriers with a large number of ion conductors.

In a further particularly advantageous embodiment of the invention, the memory material comprises a further tunnel barrier, the tunnel resistance of which, serving as a memory property, can be changed by the write signal. This can be achieved, for example, by a metal layer in the further tunnel barrier, the layer being displaceable by the write signal. It was found that this change in the memory property induced by the write signal also exponentially influences the tunnel resistance: for example, if both tunnel barriers adjoin each other, and thereby form a large tunnel barrier, the metal layer which can be displaced by an electric field as the write signal determines the spatial division of this overall barrier into two partial barriers. Because the tunnel resistance depends exponentially on the effective barrier thickness, the tunnel resistance is the lowest when the overall barrier is divided exactly in half by the metal layer. In contrast, the tunnel resistance is higher by orders of magnitude when the metal layer adjoins one of the electric contacting means, and as a result each tunneling electron must traverse the length of the overall barrier. Between these two extremes is a displacement of the metal layer by only a few nanometers, which can be adjusted quickly and reversibly using fields that are weaker than the write fields used previously for resistive memories. Tunnel barriers are typically between 0.2 nm and 10 nm thick.

The memory property of the memory material should be designed to remain stable for at least another 100 ns after the write signal has been discontinued. This time is sufficient for the memory to be used analogously to the present dynamic RAM (DRAM) as a volatile memory, which is refreshed on a regular basis. DRAM is typically refreshed at intervals of 1 ms. If the memory property remains stable over an extended period (5,000, preferably 50,000 hours), the memory can also be used as non-volatile memory. It can then function as universal memory, which replaces both existing random access memories and existing bulk memories.

The memory material advantageously has a bistable or multistable memory property. This means that the memory property thereof can take on one of two or more possible discrete states. If the memory property is bistable, the two binary logic states 0 and 1 can be stored. The higher the number of possible states, the greater the information density of each memory cell. For example, three bits can already be stored with $8=2^3$ possible states in a memory cells. The higher the number of states, however, the lower the energy gap between adjoining states. Consequently, there arises a risk of "tipping over" from one state into a neighboring state, due to aging of the memory or environmental influences.

However, the memory property does not need to be bistable or multistable for all applications. If the memory property can be changed continuously as a function of the strength of the write signal, for example analog measured values can be stored temporarily in an analog circuit for further processing, without the discretization in an analog-to-digital converter resulting in loss of information.

Within the scope of the invention, a method was developed for storing information in a memory having a tunnel barrier and for reading the stored information. This method is characterized in that the level of the conduction band edge in the tunnel barrier and/or the spatial division of the tunnel barrier into several partial barriers is changed so as to store the information. In order to read the information, a measurement variable is measured, which represents a measure of the tunneling probability through the tunnel barrier, such as a tunnel current.

It was found that, both in changing of the level of the conduction band edge and in changing the spatial division of the tunnel barrier into several partial barriers, a small intervention induced by the write signal carrying the information has a powerful effect on the tunnel resistance because this resistance is exponentially dependent on both the effective barrier thickness and the level of the conduction band edge. These minor interventions can be carried out in a well-measured manner. In addition, it is easier to eliminate the changes effected by small interventions without residue and thereby repeatedly store new information. The powerful effect on the tunnel resistance, and hence on the measured tunneling probability, in turn causes a very good signal-to-noise ratio when reading the information. In particular manufacturing-related differences between several nominally identical memory cells are of very minor consequence, compared to the large change in the tunneling probability caused by the storage of the information, so that in an array comprising a plurality of memory cells, the cells can be regarded as being identical within the scope of certain tolerances.

The level of the conduction band edge in the tunnel barrier is advantageously changed by a change of an electric field that is supplied to an edge of the tunnel barrier. This electric field can, for example, be the field of ions that are supplied to or removed from an interface of the tunnel barrier. To this end, the ions can be bound in a memory layer adjoining the tunnel barrier, for example, in such a way that they do not leave the position they assumed during the storage of information until an opposite write signal is applied.

In a particularly advantageous embodiment of the invention, a write current is sent through the memory for storing information and a read current is sent through for reading the information, the write current being greater than the read current. Both storing and reading can then be carried out using the same control circuit, with the current requiring change only in one location.

Hereafter, the subject matter of the invention will be described in more detail based on the Figures, without thereby limiting the subject matter of the invention.

DESCRIPTION OF THE PREFERRED EMBODIMENTS

Figure 1:
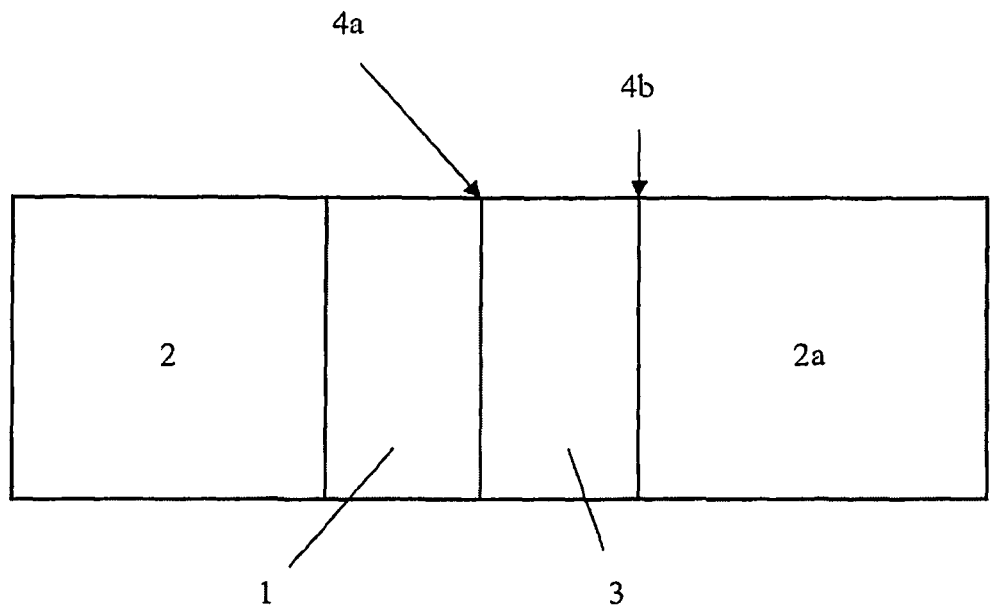
FIG. 1 schematically illustrates the design of an embodiment of the memory according to the invention.

The memory of FIG. 1 comprises a tunnel barrier 1 and metal electrodes (2a, 2b) as contact means for conducting a current through the tunnel barrier 1. The tunnel barrier 1 is in contact with a memory material 3. This memory material 3 is an electrochemical active layer, in which the positions of ions can be changed by an electric voltage that is applied between the metal electrodes (2a, 2b) as the write signal. The interface 4a of the memory material 3 with the tunnel barrier 1 and the interface 4b of the memory material 3 with the metal electrode 2b are designed as diffusion and/or migration stops and are therefore impervious to ions.

Figure 2:
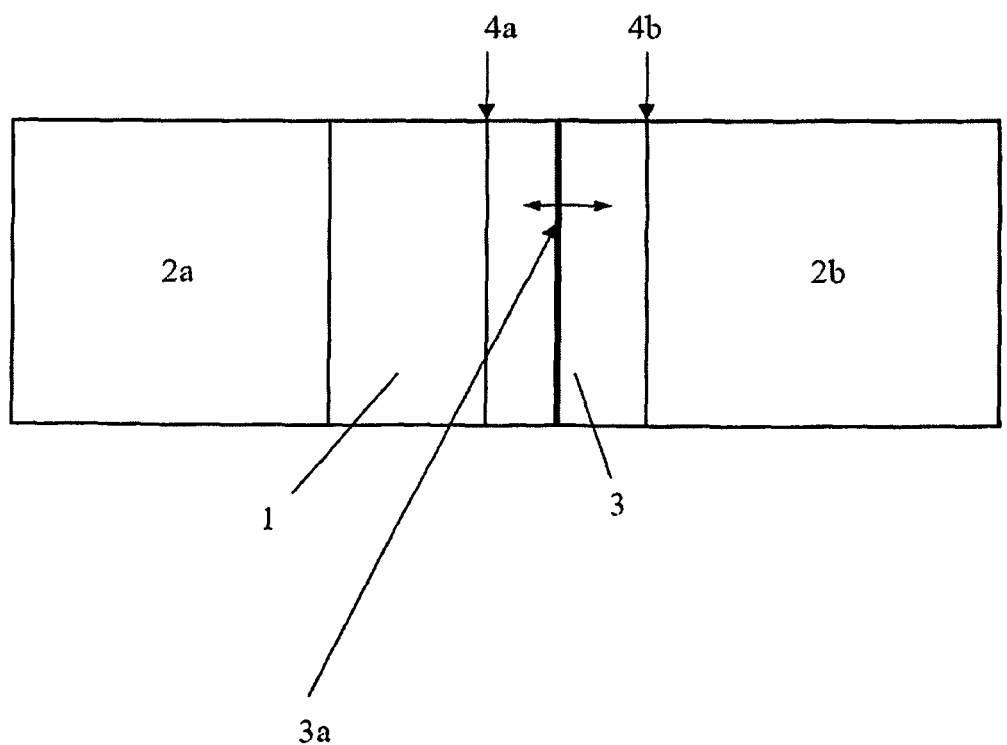
FIG. 2 schematically illustrates the design of a modified embodiment of the memory according to the invention.

In FIG. 2, the memory material 3 is a second tunnel barrier in which a metal layer 3a is embedded. This metal layer 3a can be moved as a whole in the direction of the tunnel barrier 1, or in the direction of the metal electrode 2b, by electric voltage that is applied between the metal electrodes (2a, 2b) as the write signal. The tunnel barrier 1 and the memory material 3 together form a single tunnel barrier, which is composed of two partial barriers separated from each other by the metal layer 3a: the first partial barrier extends from the metal electrode 2a to the metal layer 3a, and the second partial barrier extends from the metal layer 3a to the metal electrode 2b. Because the tunnel resistance of each partial barrier depends exponentially on the length thereof, the total resistance of the series connection of the two partial barriers is lowest when the metal layer 3a is located at the interface between the memory material 3 and the tunnel barrier 1. In contrast, the total resistance is highest when the metal layer 3a is located at the interface between the memory material 3 and the metal electrode 2b.

A plurality of units (cells) of the memory according to the invention can advantageously be arranged in a "cross-bar array" so as to store larger amounts of information. Such an array comprises an arrangement of parallel word lines, which are generally disposed on a substrate. Units of the memory according to the invention are placed on the word lines, preferably at regular intervals. Bit lines are in turn placed on the memory units, with the bit lines running perpendicular to the word lines and connecting the memory units to each other. Precisely one memory unit is therefore located between a given word line and a given bit line. By applying a write voltage between this word line and this bit line, information can be written to this memory unit. By querying the resistance between this word line and this bit line, the information can be read from the memory unit.

The invention claimed is:
1. A memory for information, comprising:
a first tunnel barrier;
a memory material in contact with the first tunnel barrier and having a memory property that is changed by a write signal, the memory material comprising a second tunnel barrier; and electric contacting means for conducting a current through the first tunnel barrier; and wherein a change in the memory property results in a change in tunnel resistance for the current flowing through the first tunnel barrier;

wherein the second tunnel barrier has tunnel resistance as a storage characteristic that is changeable by the write signal; and wherein the first tunnel barrier and the second tunnel barrier adjoin each other to form a combined tunnel barrier, and wherein a level of a conduction band edge between the first tunnel barrier and second tunnel barrier is changeable by the write signal;

wherein positions of ions serving as the memory property are changed in the memory material by the write signal; and wherein the memory material comprises a solid electrolyte.

2. The memory according to claim 1, wherein interfaces of the memory material with each of the first tunnel barrier and the electric contacting means are inert.

3. A memory for information, comprising:
a first tunnel barrier;
a memory material in contact with the first tunnel barrier and having a memory property that is changed by a write signal, the memory material comprising a second tunnel barrier; and
electric contacting means for conducting a current through the first tunnel barrier; and
wherein a change in the memory property results in a change in tunnel resistance for the current flowing through the first tunnel barrier;
wherein the second tunnel barrier has tunnel resistance as a storage characteristic that is changeable by the write signal; and
wherein the first tunnel barrier comprises an amorphous material.

4. A memory for information, comprising:
a first tunnel barrier;
a memory material in contact with the first tunnel barrier and having a memory property that is changed by a write signal, the memory material comprising a second tunnel barrier;
electric contacting means for conducting a current through the first tunnel barrier; and
a metal layer in the second tunnel barrier, the layer being displaceable by the write signal; and
wherein a change in the memory property results in a change in tunnel resistance for the current flowing through the first tunnel barrier; and
wherein the second tunnel barrier has tunnel resistance as a storage characteristic that is changeable by the write signal.

5. A memory for information, comprising:
a first tunnel barrier;
a memory material in contact with the first tunnel barrier and having a memory property that is changed by a write signal, the memory material comprising a second tunnel barrier; and
electric contacting means for conducting a current through the first tunnel barrier; and
wherein a change in the memory property results in a change in tunnel resistance for the current flowing through the first tunnel barrier;
wherein the second tunnel barrier has tunnel resistance as a storage characteristic that is changeable by the write signal; and wherein the memory property of the memory material remains stable for at least 100 ns after the write signal has been discontinued.

6. The memory according to claim 1, wherein the memory material has a bistable or multistable memory property.

7. A method for storing and reading information in a memory comprising a first tunnel barrier and a second tunnel barrier, comprising:
changing tunnel resistance of each of the first tunnel barrier and the second tunnel barrier to achieve storing of said information; and
measuring a measurement variable, which represents a measure of the tunneling probability through the first tunnel barrier and the second tunnel barrier, to achieve reading of said information; and
wherein during said changing a level of a conduction band edge in the first tunnel barrier is changed by a change of an electric field that is supplied to an edge of the first tunnel barrier.

8. A method for storing and reading information in a memory comprising a first tunnel barrier and a second tunnel barrier, comprising:
changing tunnel resistance of each of the first tunnel barrier and the second tunnel barrier to achieve storing of said information; and
measuring a measurement variable, which represents a measure of the tunneling probability through the first tunnel barrier and the second tunnel barrier, to achieve reading of said information; and
wherein the first tunnel barrier and the second tunnel barrier adjoin each other to form a combined tunnel barrier;
wherein said changing comprises changing level of a conduction band edge between the first tunnel barrier and second tunnel barrier by a write signal; and
wherein the level of the conduction band edge is changed by a change of an electric field that is supplied to an edge of the first tunnel barrier.

9. The method according to claim 8, wherein a write current is sent through the memory for storing information and a read current is sent through for reading the information, the write current being greater than the read current.

10. The memory according to claim 2, wherein interfaces of the memory material with each of the second tunnel barrier and the electric contacting means are inert.

11. A memory for information, comprising:
a first tunnel barrier;
a memory material in contact with the first tunnel barrier and having a memory property that is changed by a write signal, the memory material comprising a second tunnel barrier; and
electric contacting means for conducting a current through the first tunnel barrier; and
wherein a change in the memory property results in a change in tunnel resistance for the current flowing through the first tunnel barrier;
wherein the second tunnel barrier has tunnel resistance as a storage characteristic that is changeable by the write signal;
wherein the first tunnel barrier and the second tunnel barrier adjoin each other to form a combined tunnel barrier, and wherein a level of a conduction band edge between the first tunnel barrier and second tunnel barrier is changeable by the write signal; and
wherein in response to the write signal a conduction band edge of the second tunnel barrier away from said conduction band edge between the first tunnel barrier and second tunnel barrier also is changeable.

12. The method of claim 8, wherein said changing further comprises changing level of a conduction band edge of the second tunnel barrier away from said conduction band edge between the first tunnel barrier and second tunnel barrier.

\* \* \* \* \*